(12) United States Patent
Reiss et al.

(10) Patent No.: US 7,387,833 B2
(45) Date of Patent: Jun. 17, 2008

(54) LUMINESCENT MATERIALS CONSISTING OF NANOCRYSTALS WITH CORE/SHELL STRUCTURE AND METHOD FOR PREPARING SAME

(75) Inventors: Peter Reiss, Saint Egreve (FR); Joel Bleuse, Grenoble (FR); Adam Pron, Saint Egreve (FR)

(73) Assignee: Commissariat a l'Energie Atomique, Paris (FR)

( * ) Notice: Subject to any disclaimer, the term of this patent is extended or adjusted under 35 U.S.C. 154(b) by 763 days.

(21) Appl. No.: 10/478,693

(22) PCT Filed: Apr. 8, 2003

(86) PCT No.: PCT/FR03/01104

§ 371 (c)(1),
(2), (4) Date: Dec. 8, 2003

(87) PCT Pub. No.: WO03/085066

PCT Pub. Date: Oct. 16, 2003

(65) Prior Publication Data

US 2004/0151898 A1  Aug. 5, 2004

(30) Foreign Application Priority Data

Apr. 9, 2002 (FR) .................. 02 04398

(51) Int. Cl.
*B32B 5/66* (2006.01)
(52) U.S. Cl. .................. 428/403; 428/404; 428/405; 428/406; 428/407; 252/301.4 R; 252/301.4 S; 257/E33.005
(58) Field of Classification Search .................. 428/403, 428/404, 405, 406, 407
See application file for complete search history.

(56) References Cited

U.S. PATENT DOCUMENTS 6,207,229 B1   3/2001  Bawendi et al.
6,251,303 B1 * 6/2001  Bawendi et al. ....... 252/301.4 R

FOREIGN PATENT DOCUMENTS

WO  99/26299   * 5/1999
WO  01/07689     2/2001

OTHER PUBLICATIONS

Talapin et al., Nano letters, 2001, vol. 1, No. 4, 207-211.*
Talapin D, et al.: "Highly luminescent monodisperse CdSe and CdSe/ZnS nanocrystals synthesized in a Hexadecylamine-Trioctylphosphine Oxide-Tricotylphospine mixture", Nano Letters, vol. 1, No. 4, pp. 207-211 2001.
Horst Weller, Angew. Chem. Int. English Edition, vol. 32, pp. 41-53 1993.
Lubomir Spanhel, et al., J. Am. Chem. Soc. vol. 109, pp. 5649-5655 1987.
T. Vossmeyer, et al., J. Phys. Chem. vol. 98, pp. 7665-7673 1994.
M.P. Pileni, et al., Langmuir, vol. 13, pp. 3266-3276 1997.
C.B. Murray, et al., J. Am. Chem. Soc. vol. 115, pp. 8706-8715 1993.
Z. Adam Peng, et al., J. Am. Chem. Soc. vol. 123, pp. 183-184 2001.
Margaret A. Hines, et al., J. Phys. Chem. vol. 100, pp. 468-471 1996.
B.O. Dabbousi, et al., J. Phys.Chem. B, vol. 101, pp. 9463-9475 1997.
Xiaogang Peng, et al., J. Am. Chem. Soc. vol. 119, pp. 7019-7029 1997.
Michal Danek, Chem. Mater. vol. 8, pp. 173-180 1996.

* cited by examiner

*Primary Examiner*—Leszek Kiliman
(74) *Attorney, Agent, or Firm*—Oblon, Spivak, McClelland, Maier & Neustadt, P.C.

(57) ABSTRACT

Luminescent material consisting of nanocrystals comprising a core surrounded by a shell, said core consisting of a nanocrystal of semiconductor of formula AB in which A represents a metal or a metalloid in oxidation state (II) and B represents a chemical element in oxidation state (VI), and said shell consisting of a ZnSe layer whose surface is provided with an organic passivation layer consisting of at least one primary amine combined with at least one phosphine oxide and/or phosphine selenide compound.

The invention relates in particular to nanocrystals with a CdSe core, these being covered by a ZnSe shell.

The invention furthermore relates to a method of preparing these materials.

53 Claims, 4 Drawing Sheets

LUMINESCENT MATERIALS CONSISTING OF NANOCRYSTALS WITH CORE/SHELL STRUCTURE AND METHOD FOR PREPARING SAME

The invention relates to luminescent materials consisting of nanocrystals comprising a core of A(II)B(VI) semiconductor surrounded by a shell, also called "core/shell nanocrystals".

In particular, the invention relates to nanocrystals with a CdSe core covered by a ZnSe shell.

The invention also relates to a method of preparing these materials.

The technical field of the invention can be defined in general as that of luminescent materials and, in particular, of luminescent materials formed by crystals of semiconductors of formula A(II)B(VI) in which A represents a metal or a metalloid in oxidation state II and B represents a chemical element, such as a metal or a metalloid, in oxidation state VI.

A(II)B(VI) semiconductor crystals are luminescent materials that have been known for several decades.

During the 80s, it was demonstrated that their emission spectra depend on the size of the crystal when this becomes sufficiently small. For crystals whose size lies approximately within the range from 1 to 10 nm, which are therefore called "nanocrystals" or "quantum boxes", this dependency is extremely pronounced (Angew. Chem. Int. English Edition, 32, pages 41-53 (1993)).

Thus, the entire palette of colours in the visible and in the near infrared and ultraviolet may be obtained with A(II)B(VI) semiconductor nanocrystals by suitably choosing their size and composition.

In general, the optical quality of a luminescent material made from nanocrystals depends on several parameters, the most important ones being:

the size of the nanocrystals, which governs the emission wavelength and therefore the colour emitted, as indicated above;
the size distribution of the nanocrystals, which controls the emission line width; and
the passivation of the surface of the nanocrystals, which is responsible for the fluorescence quantum yield.

There are several methods of preparing A(II)B(VI) nanocrystals. The first methods of preparing these crystals were developed in aqueous medium (J. Am. Chem. Soc., 109, pages 5 649-5 655 (1987); J. Phys. Chem., 98, pages 7 665-7 673 (1994)) or in water/organic medium mixtures: for example, there is what is called the "reverse micelle" method (Langmuir, 13, pages 3 266-3 276 (1997)).

These aqueous synthesis procedures for producing nanocrystals of A(VI)B(II) semiconductors result, however, in specimens whose low luminescence efficiency and large spectral width are major technological drawbacks.

It is for these reasons that other methods of preparation were developed.

The article J. Am. Chem. Soc., 115, pages 8 706-8 715 (1993) thus describes an organometallic synthesis procedure of producing CdB nanocrystals (in which B=S, Se, Te). The main advantage of this organometallic method compared with the aforementioned methods in aqueous medium lies in the fact that the nanocrystals thus prepared exhibit a much better size distribution, which is generally less than 10%.

This size distribution leads to a much narrower emission spectrum, which is of course advantageous for technological applications. The main organometallic synthesis procedures for preparing CdSe nanocrystals are the following:

the conventional organometallic synthesis procedure consists in making a dialkylcadmium, preferably dimethylcadmium or diethylcadmium, react with selenium, both of these being dispersed in trioctylphosphine (TOP); this dispersion is injected into trioctylphosphine oxide (TOPO) at high temperature, which serves as reactive medium. This synthesis is described in the document J. Am. Chem. Soc., 115, pages 8 706-8 715 (1993);

a modification of the above synthesis method was described in the document Nanoletters, 1(4), pages 207-211 (2001); in this method, the reactive medium, instead of TOPO, is a mixture of TOPO and hexadecylamine (HDA). The authors report an improvement in the width of size distribution, which is around 5%;

another modification was proposed by Z. A. Peng and X. Peng in the document J. Am. Chem. Soc., 123, pages 183-184 (2001); these authors replace the pyrophoric dialkylcadmium compounds with cadmium oxide (CdO) complexed by an alkylphosphonic acid. The main advantage of this procedure is that CdO constitutes a source of cadmium that is much less reactive and easier to handle than dialkylcadmium compounds.

The methods of preparation described above do not solve the problem of the fluorescence quantum yield, which remains low, typically between 5 and 10%.

In the article J. Phys. Chem., 100, pages 468-471 (1996), a method is proposed for increasing this yield. It consists in passivating nanocrystals, of CdSE in this case, by growing around this "core" a shell of a semiconductor having a band gap greater than that of the core, this semiconductor consisting of ZnS. Such a system is called a "core/shell" system in the scientific literature. The methods used to deposit the shell are essentially the same as those employed for preparing the core. A ZnS shell is deposited, for example, using highly reactive compounds, namely diethylzinc and bis(trimethylsilyl)sulphide. After the shell has been grown, the authors observe an increase in fluorescence quantum yield towards values between 10 and 50% at room temperature.

M. G. Bawendi et al. describe the preparation of this type of CdSe/ZnS core/shell nanocrystal in the article J. Phys. Chem. B, 101, pages 9 463-9 475 (1997) and in U.S. Pat. No. 6,207, 229 and WO-99/26299.

The article J. Am. Chem. Soc., 119, pages 7 019-7 029 (1997) describes the preparation of CdSe/CdS core/shell nanocrystals. The authors report an increase in the fluorescence quantum yield at room temperature, up to a value of at least 50%.

The article Chem. Mater., 8, pages 173-180 (1996) describes an attempt to synthesize CdSe/ZnSe core/shell nanocrystals, however the results are essentially negative since the fluorescence quantum yield is about 0.4%, i.e. much less than in the case of bare CdSe cores. In this case, growing the ZnSe shell does not improve the luminescence properties of the core nanocrystals, since on the contrary it greatly degrades them.

It follows from the above that there is still no luminescent material all of whose optical properties are satisfactory at the same time.

In particular, the fluorescence quantum yield of the materials known hitherto is still greatly insufficient, and requires to be improved.

There is therefore a need for a luminescent material all of whose optical properties are satisfactory and better than those of the luminescent materials in the prior art described above.

In particular, there is a need for a luminescent material whose quantum yield is very high and greater than that of the materials of the prior art.

One goal of the present invention is to provide a luminescent material that meets the above-mentioned needs and requirements.

Another goal of the present invention is to provide a luminescent material that does not have the drawbacks, defects, limitations and disadvantages of the materials of the prior art and that solves the problems of the materials of the prior art.

These goals and others are achieved according to the invention by a luminescent material consisting of nanocrystals comprising a core surrounded by a shell, said core consisting of a nanocrystal of semiconductor of formula AB in which A represents a metal or a metalloid in oxidation state (II) and B represents a chemical element, such as a metal or a metalloid, in oxidation state (VI), and said shell consisting of a ZnSe layer whose surface is provided with an organic passivation layer consisting of at least one primary amine combined with at least one phosphine oxide and/or phosphine selenide compound.

Said ZnSe layer is advantageously an epilayer (epitaxially grown layer).

A is generally chosen from Cd and Hg, while B is generally chosen from Se, S and Te.

Advantageously, the semiconductor of formula AB is CdSe for which the effects and advantages of the material according to the invention are particularly pronounced.

Advantageously, the primary amine is chosen from alkylamines whose alkyl group contains from 6 to 24 carbon atoms, preferably 14 to 24 carbon atoms, such as hexadecylamine (HDA) (16 carbon atoms).

Advantageously, the phosphine oxide is chosen from trialkylphosphine oxides whose alkyl group contains from 4 to 12 carbon atoms, such as trioctylphosphine oxide (TOPO).

Advantageously, the phosphine selenide is chosen from trialkylphosphine selenides whose alkyl group contains from 4 to 12 carbon atoms, such as trioctylphosphine selenide (TOPSe).

Advantageously, the organic passivation layer consists of hexadecylamine (HDA) and/or trioctylphosphine oxide (TOPO) and/or trioctylphosphine selenide (TOPSe).

According to one particularly advantageous feature of the material according to the invention, the semiconductor nanocrystal core has a diameter ranging from 2 to 7 nm.

All the optical properties of the material according to the invention, precisely because of its specific structure, are, surprisingly, excellent simultaneously and superior to those of the materials of the prior art.

The material according to the invention has in particular a high colour purity and a better fluorescence quantum yield than the materials of the prior art, whilst still covering most of the visible spectrum.

Thus, the fluorescence quantum yield at room temperature of the materials according to the invention is higher than all the known A(II)B(VI) semiconductor core/shell nanocrystals in the prior art.

For example, this yield exceeds 60% and may, preferably, exceed 80%, and is for example 85%, at room temperature. This extremely high yield is furthermore—which constitutes an additional advantage of the materials of the invention—combined with a very narrow and symmetrical emission line.

Thus, the nanocrystals of core/shell structure under excitation emit in the 470 to 630 nm spectral range. The position of the first peak of the adsorption spectrum can be very precisely adjusted within this range. The nanocrystals of core/shell structure have an emission line with a half-height width of less than or equal to 30 nm, for example 25 to 30 nm, and, finally, the nanocrystals forming the core have a chosen size distribution with a size dispersion standard deviation of less than 5%.

The invention also relates to a method of preparing nanocrystals made of a semiconductor of formula AB where A represents a metal or a metalloid in oxidation state (II) and B represents a chemical element, such as a metal or a metalloid, in oxidation state (VI), in which an oxide of A complexed by an alkylphosphonic acid is made to react with powder of B dissolved in a trialkylphosphine, the reaction taking place in a solvent consisting of a mixture of at least one trialkylphosphine oxide and at least one primary alkylamine.

Advantageously, A is chosen from Cd and Hg.

B is advantageously chosen from Se, S and Te.

Advantageously, AB is CdSe, the oxide of A is CdO and the powder of B is selenium powder.

Advantageously, the alkylphosphonic acid satisfies the formula:

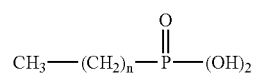

where n is an integer from 5 to 15.

Advantageously, the alkyl group of the alkylamine contains from 6 to 24, preferably 14 to 24, carbon atoms, preferably 16 carbon atoms.

Advantageously, the alkyl groups of the trialkylphosphine and of the trialkylphosphine oxide contain from 4 to 12 carbon atoms, preferably 8 carbon atoms (trioctylphosphine and trioctylphosphine oxide).

Advantageously, the solvent consists of a mixture of an alkylamine and a trialkylphosphine oxide, preferably a mixture of trioctylphosphine oxide (TOPO) and hexadecylamine (HDA).

Preferably, the solvent consists, in mol %, of 40 to 20% TOPO and 60 to 80% HDA.

Advantageously, the reaction is carried out at a temperature of 240 to 300° C.

The method according to the invention for preparing AB semiconductor nanocrystals ("core nanocrystals") involves specific reactants, steps, solvents and reaction conditions that have never been described or suggested in the prior art.

In particular, the combination as reactant of an oxide of A and as solvent of a specific mixture consisting of a mixture of at least one trialkylphosphine oxide and a primary alkylamine, such as an HDA/TOPO mixture, has neither been described nor suggested in the prior art.

In other words, the method according to the invention uses a mixture of reactants and of solvents that have never been used simultaneously.

For example, CdO has admittedly been used in the article J. Am. Chem. Soc. V. 123, pages 183-184 (2001), but with pure TOPO as solvent. Likewise, the TOPO/HDA solvent mixture is described in the article Nanoletters, V 1(4), pages 207-211 (2001), but with dimethylcadmium as reactant. Nothing in that document may lead one to use the mixture with an oxide-type reactant precursor, such as CdO, instead of the organocadmium. Nothing leaves one to assume all the advantages associated with the use according to the invention of an oxide precursor with a solvent mixture, the optimal advantages being achieved within the above ranges of molar fractions and with the specific compounds HDA and TOPO.

The process according to the invention is of great simplicity, great reliability and great reproducibility, and involves a succession of simple steps with readily available reactants.

Owing to the excellent reproducibility of the method of preparation, the position of the first peak of the absorption spectrum or the emission line may very precisely be adjusted within a very wide range of the visible spectrum, namely 470 to 630 nm.

Surprisingly, the method according to the invention makes it possible to obtain nanocrystals ("cores"), for example CdSe nanocrystals, the size distribution of which is the narrowest of all the similar nanocrystals known hitherto. This size distribution is obtained directly from the synthesis, without it being necessary to use complex sorting or classifying operations, as would be the case in the prior art. The mid-height width of the distribution is, for example, typically less than or equal to 5%.

The specific characteristics of the method of preparing the "core" nanocrystals according to the invention have a direct influence and are for the most part the origin of the excellent optical properties inherent in the core/shell nanocrystals indicated above.

The invention also relates to a method of preparing nanocrystals comprising a core surrounded by a ZnSe shell, in which:

firstly, core nanocrystals made of semiconductor of formula AB, in which A represents a metal or a metalloid in oxidation state (II) and B represents a chemical element, such as a metal or a metalloid, in oxidation state (VI), are prepared using the above process;

said core nanocrystals are dispersed in a solvent consisting of a mixture of at least one trialkylphosphine oxide and of at least one primary alkylamine; and a solution of a source of zinc, chosen from complexed ZnO and zinc carboxylates of formula $Zn(RCOO)_2$, where R represents an aliphatic alkyl group containing from 1 to 4 carbon atoms, and a solution of selenium powder in a trialkylphosphine are added to said dispersion of core nanocrystals heated to a temperature of 170 to 210° C., by means of which a ZnSe shell is grown on the semiconductor core nanocrystals.

Advantageously, the ZnSe layer is grown epitaxially.

Advantageously, the reaction mixture obtained during the previous step is maintained at a temperature of 170 to 210° C. for a time of one to two hours.

A and B have already been defined above, as have the alkylamine, the trialkylphosphine and the trialkylphosphine oxide.

Advantageously, the solvent consists of a mixture of trioctylphosphine oxide (TOPO) and hexadecylamine (HDA), the solvent preferably consisting, in mol %, of 40 to 20% of TOPO and 60 to 80% HDA.

The ZnO, which serves as a zinc source, is complexed, preferably by an alkylphosphonic acid whose formula has already been indicated above—again preferably this is dodecylphosphonic acid (DDPA).

Among zinc carboxylates, zinc stearate is preferred.

Advantageously, the zinc source solution and the selenium powder solution are mixed together prior to the addition, and then their mixture is injected into the dispersion of core nanocrystals.

Advantageously, the addition of the zinc source solution and the selenium powder solution is carried out very slowly and at a constant rate, namely, preferably, over a time ranging from 30 to 90 minutes.

This method has all the advantages inherent in the method of preparing core nanocrystals that was described above and all the advantages inherent in the intrinsic properties of these core nanocrystals, which were mentioned above.

The method according to the invention makes use of zinc precursor sources, namely either ZnO preferably complexed by dodecylphosphonic acid, on the one hand, or a zinc carboxylate, such as zinc stearate on the other, these never having been used to grow a ZnSe shell.

These compounds are readily available and much easier to employ than the alkylzinc-type organometallics used in the similar methods of the prior art.

The carboxylate offers the additional advantage of requiring no complexation.

Basically, the shell growth reaction is carried out in a specific solvent consisting of a trialkylphosphine oxide/alkylamine mixture. It is precisely and in particular the use of this specific mixture, optionally combined with the choice of other specific reaction conditions, which essentially allows the ZnSe to be epitaxially grown on the surface of the cores.

Such growth is responsible for the superior optical properties, already mentioned above, of the core/shell nanocrystals thus prepared.

The invention will be more clearly understood on reading the detailed description that follows, given by way of illustration but implying no limitation, this description being given with reference to the appended drawings in which:

FIG. 1 is a graph showing the room-temperature photoluminescence spectra of the dye RHODAMINE 6G (dotted curve) and of CdSe/ZnSe core/shell nanocrystals according to the invention (solid curve). In the graph, the wavelength λ (in nm) is plotted on the x-axis and the photoluminescence intensity I (in arbitrary units a.u.) is plotted on the y-axis;

FIG. 2 illustrates the variation as a function of synthesis time of the adsorption spectra (solid curves) and of the photoluminescence (dotted curves) of CdSe core nanocrystals prepared by the method of the invention. Plotted on the x-axis is the wavelength λ (in nm) and plotted on the y-axis on the left is the absorbence A (in arbitrary units) and, on the right, the photoluminescence intensity I (in arbitrary units). Curves A, B, C, D, E, F correspond to synthesis times of 90 s, 3 min, 5 min, 10 min, 30 min and 60 min, respectively.

Figure 1:
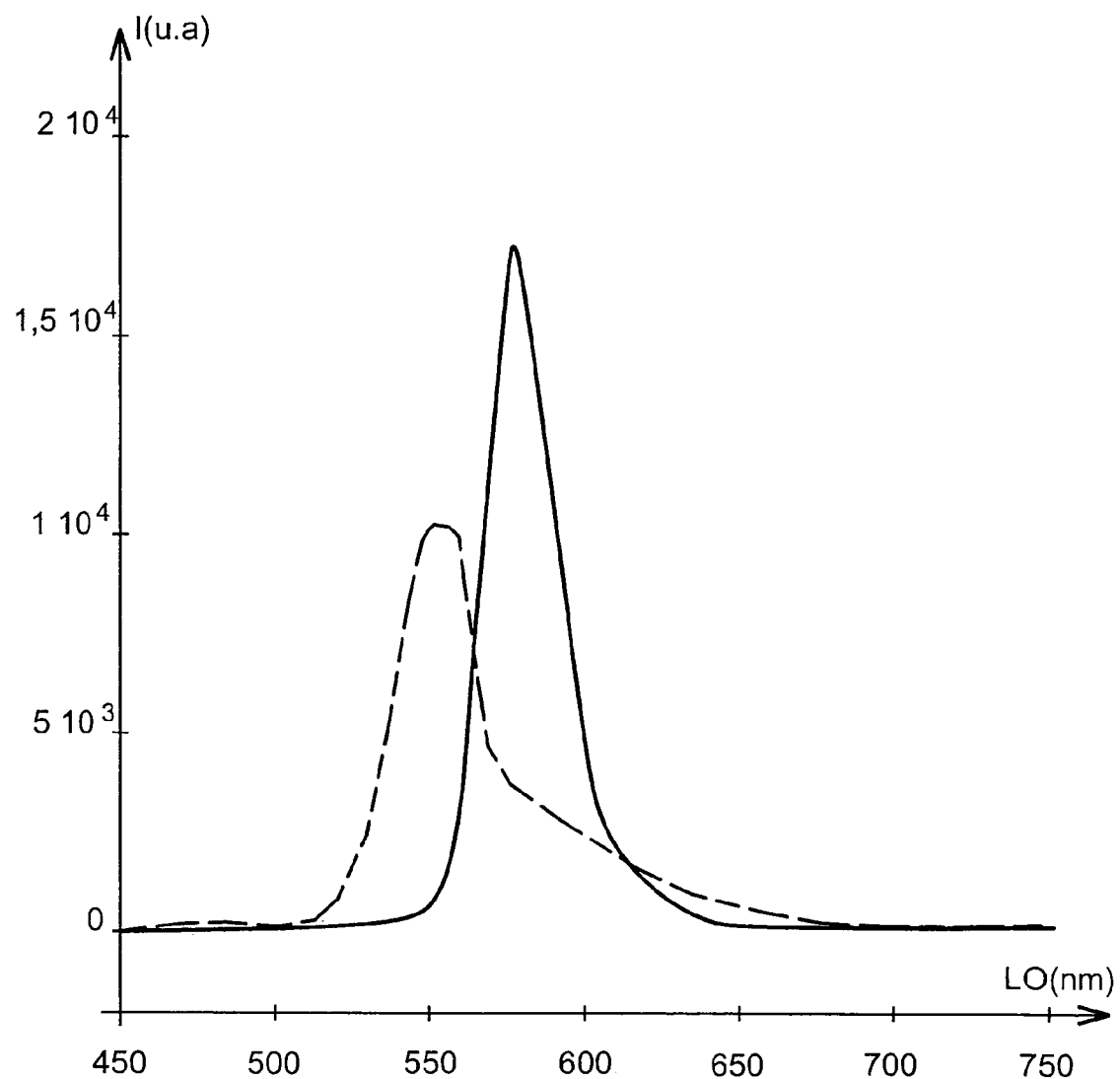

In detail, to prepare the materials according to the invention, so as to synthesize AB semiconductor nanocrystals, an oxide of A is firstly made to react with a powder of B.

As specific reactant according to the invention, an oxide of A, such as CdO or HgO, is chosen as such an oxide reactant, for example CdO, proves to be less reactive and easier to use than dialkylmetal compounds, such as for example the dialkyl cadmium compounds used in the prior art.

It is generally necessary to complex the oxide of A, such as CdO, with an alkylphosphonic acid.

Various high-boiling-point alkylphosphonic acids may in principle be used as complexants, such acids satisfying, for example, the formula:

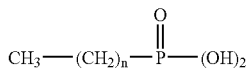

where n is an integer from 5 to 15.

The preferred complexant is dodecylphosphonic acid (DDPA).

The powder of B is the second specific reactant of the method according to the invention. Preferably, this will be a powder of Se, Te or S, Se being preferred. This reactant is generally dissolved in a trialkylphosphine, the alkyl group of which has from 4 to 12 carbon atoms, the preferred trialkylphosphine being trioctylphosphine. The concentration of B powder in the trialkylphosphine is generally from 0.1M to 0.5M.

According to the invention, the reaction takes place in a specific solvent consisting of a mixture of at least one trialkylphosphine oxide and at least one primary alkylamine.

The primary alkylamine is generally chosen from long-chain primary amines, that is to say those containing from 6 to 24, preferably 14 to 24, carbon atoms, and having a high boiling point; again preferably, the amine is hexadecylamine (HDA).

The trialkylphosphine oxide is generally chosen from trialkylphosphine oxides whose alkyl group contains from 4 to 12 carbon atoms, trioctylphosphine oxide (TOPO) being preferred.

It has been found, according to the invention, that the relative molar concentration of each of the compounds involved in the solvent mixture has an influence on the rate of growth and the size distribution of the nanocrystals; the mixture therefore generally contains from 50 to 90 mol % alkylamine, for example HDA.

A preferred molar concentration of alkylamine, for example HDA, is 60 to 80 mol %.

When typically carrying out the method of the invention, the solvent mixture, for example TOPO/HDA, and the oxide, for example CdO, are heated in a round-bottomed flask to a temperature of above the melting point of the solvents, this temperature therefore being generally above 60° C., preferably 150 to 250° C.

The complexant, such as DDPA, is then added and the temperature increased up to about 260-300° C. During this heating, the oxide powder, such as CdO, dissolves and, in the case of CdO, a colourless transparent solution forms.

The temperature of the complexation reaction depends strongly on the relative amounts of the two compounds forming the solvent, for example HDA and TOPO, and decreases when the relative concentration of trialkylphosphine oxide, for example TOPO, increases.

The solution of B, for example of Se, in the trialkylphosphine, for example TOP, is prepared separately at room temperature, and then very rapidly injected into the flask. The temperature of the reactive mixture in the flask during injection is of crucial importance. Preferably, it must be between 240 and 300° C.

It should be noted here that the temperature of the reactive mixture greatly influences the nucleation and the growth of nanocrystals. In general, for similar reaction times, smaller nanocrystals are formed at low temperatures. For a given temperature, the final size of the nanocrystals is determined by the reaction time. The reaction time is, for example, from 2 to 90 minutes.

The reaction may be stopped at any moment by cooling the reactive mixture in order to obtain a specimen of nanocrystals with the desired size. The nanocrystals are then precipitated by adding a suitable mixture, for example methanol/n-butanol, and are then separated, for example by centrifugation, and purified.

It should be pointed out that the method according to the invention, described above provides core nanocrystals of higher quality than those obtained by the methods described in the prior art, as may be judged on the basis of the optical spectroscopy and TEM (transmission electron microscopy) data.

This is due to a very narrow size distribution, which is a major advantage of the method of the invention. In the methods of the prior art, a sorting step—which is expensive in terms of material—so as to sort the nanocrystals into fractions of a given size must necessarily be used in order to obtain specimens whose size distribution width is as narrow as that obtained directly by the method of the invention, namely less than 5%.

The method according to the invention therefore dispenses with this fractionation and is considerably more simple than the methods of the prior art.

After the semiconductor nanocrystals have been prepared, a shell, which according to the invention is specifically ZnSe, is synthesized and grown on said nanocrystals.

The choice of ZnSe as shell material is surprising and goes counter to the teachings of the prior art. This is because, despite the fact that, for example, the article Chem. Mater., 8, pages 173-180 (1996), dealing with the (CdSe/ZnSe) system reports very poor results as regards the fluorescence quantum yield, the inventors have shown that this core/shell pair constitutes, in fact, one of the better pairs, if not the best possible pair, of A(II)B(VI) compounds.

It would appear that the negative results obtained by the authors of that article were in fact due to inappropriate reaction conditions and/or an inappropriate method of preparation.

The main argument in favour of the CdSe/ZnSe system, as opposed to the more studied CdSe/ZnS system, lies in the much smaller crystal lattice mismatch between the core and shell materials, which favours epitaxial growth of the shell on the core. The crystal lattice mismatch is 10.6% in the case of the CdSe/ZnS pair, whereas it is only 6.3% in the case of the CdSe/ZnSe pair according to the invention.

According to the invention, two specific types of zinc precursor were chosen for preparing the shell: zinc oxide (ZnO) and a zinc carboxylate of general formula:

where R represents an aliphatic alkyl group containing from 1 to 24 carbon atoms; the preferred zinc carboxylate is zinc stearate of formula:

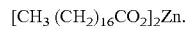

It should be noted that neither of these two compounds has ever been used for this purpose.

The advantage of using them stems in particular from the fact that they are compounds that are produced on an industrial scale, are inexpensive and much easier to handle than the dialkylzinc compounds used hitherto in the prior art.

In the case of ZnO, the complexation by an alkylphosphonic acid, already described above, is required, as in the case of preparing the core from, for example, CdO.

ZnO is complexed, for example, by dodecylphosphonic acid (DDPA) in a trialkylphosphine oxide, for example TOPO, between 350 and 360° C.

The colourless solution obtained is diluted to a 0.1M to 0.5M concentration, for example at about 60° C. in a small amount of toluene or any other solvent, for example allowing its Theological properties to be improved.

The use of a zinc carboxylate, such as zinc stearate, is again simpler since the product is simply diluted in a suitable solvent, such as toluene, without the complexation step.

The selenium source is the same as for preparing the core, namely selenium powder dissolved in a trialkylphosphine, preferably in TOP. This solution is mixed at room temperature with the solution containing the zinc source (oxide or carboxylate). The resulting mixture may furthermore be easily injected, using a syringe, into the flask where the synthesis takes place.

For growing the shell, the injection takes place in a solvent consisting of a mixture of at least one trialkylphosphine oxide and at least one primary alkylamine, the preferred mixture consisting of a TOPO/HDA mixture. The solvent mixture, for example TOPO/HDA contains a dispersion of core nanocrystals, for example CdSe nanocrystals.

The temperature of this mixture is of primary importance. If too low, no ZnSe crystal growth reaction takes place. Conversely, if this temperature is too high, crystalline nuclei of ZnSe form and ZnSe nanocrystals appear instead of epitaxial growth of ZnSe on the cores, for example CdSe cores. In addition, too high a temperature may result in a broadening of the size distribution of the nanocrystals, for example CdSe nanocrystals, owing to the fact of there being material exchange between the nanocrystals by dissolution followed by redeposition. In this context, the use of a trialkylphosphine oxide/primary alkylamine solvent mixture, for example TOPO/HDA, with a high HDA content, namely 50 to 80 mol %, plays a crucial role. The HDA is less strongly bonded to Zn than the TOPO, thus allowing the shell to form at lower temperatures. In addition, because of less stearic hindrance, the HDA provides better chemical passivation of the surface than TOPO (or TOPSe), particularly for the largest sizes of core/shell systems, having surfaces of lower curvature.

However, an alkylamine, such as pure HDA is not a suitable solvent for growth of the shell since the core nanocrystals cannot be dispersed in sufficient concentration therein.

The best results are therefore obtained with a solvent mixture preferably consisting of 60 to 80 mol % alkylamine, preferably HDA, and 40 to 20 mol % trialkylphosphine oxide, such as TOPO.

The presence of HDA on the surface of the shell may be quantitatively determined by measuring the $^1$H-NMR spectra (200 MHz; $CDCl_3$) of the nanocrystals, for example CdSe/ZnSe nanocrystals prepared by the method of the invention, thanks to the peak corresponding to the $\alpha$-$CH_2$ protons of the alkyl chain of HDA. The chemical shift, about 2.7 ppm, of the signal due to these protons allows integration relative to the other protons of HDA, TOPO and TOPSe, giving a value of 42+/-5% for the molar fraction of HDA present on the surface of the core/shell nanocrystals with a diameter of about 4.8 nm. This identification is corroborated by infrared spectroscopy. In FTIR spectra (in a KBr matrix), the HDA is responsible for the presence of additional absorption bands at 3 300-3 450 $cm^{-1}$ ($v_{N-H}$) and at 1 560-1 620 $cm^{-1}$ ($\delta_{N-H}$) that are absent from spectra of nanocrystals covered exclusively with TOPO or with TOPSe.

Finally, the choice of temperature depends on the size of the core nanocrystals, for example CdSe nanocrystals, used for the synthesis. In the great majority of cases, the temperature lies within the 170-210° C. range, the highest temperatures being used for the coarsest core nanocrystals. Since the formation of ZnSe nuclei is facilitated by a high concentration of zinc and selenium precursors, their solution must preferably be injected extremely slowly, at a constant rate, for example 3 to 10 ml per hour for a total volume of 5 ml to be injected.

For this purpose, it will be preferable to use a commercial automated microinjection system of the syringe-driver type.

After the addition of the ZnSe precursors has been completed, the reaction mixture is maintained at the synthesis temperature for a period of, for example, one to two hours in order to "anneal" the shells and improve their crystalline quality. This mixture is then cooled, for example down to about 60° C.

The precipitation (using for example a methanol/n-butanol separating mixture) and purification steps are then carried out exactly in the same way as for preparing the core nanocrystals.

The mid-height width of the emission line for the core, for example CdSe, nanocrystals, as in the case of the core/shell, for example CdSe/ZnSe, nanocrystals is extremely narrow, typically 25 to 30 nm, as synthesized, without any size-sorting procedure.

The fluorescence quantum yield at room temperature is the highest of all the A(II)B(VI) semiconductor core/shell nanocrystals prepared hitherto. It is greater than 60%, or even in some cases 80%. To give an example, FIG. 1 shows the photoluminescence spectra at T=300 K for a colloidal solution of CdSe/ZnSe core/shell nanocrystals according to the invention and of a RHODAMINE 6G solution in ethanol, having the same optical density at the excitation wavelength (365 nm). The solution of nanocrystals has a fluorescence quantum yield of 90% of that of RHODAMINE in ethanol with, as advantage, a symmetrical and much narrower (25 nm mid-height width) emission line than that of RHODAMINE 6G. This quantum yield in absolute value is 85%.

Furthermore, two points that demonstrate the advantages afforded by the method of the invention should be emphasized:

1) the growth of ZnSe shells does not result in line broadening of the optical spectra; and
2) the fluorescence quantum yield increases from 5 to 20%, going up to more than 60% after the shell has been grown.

This effect appears, by examining the variation in absorption and photoluminescence spectra, at room temperature, during growth of the ZnSe shells on CdSe core nanocrystals. During this synthesis, the zinc source is zinc stearate and core nanocrystals have a diameter of 3.6 nm with a standard deviation of less than 5%.

The final thickness of the shells is about 2.1 monolayers (ML). A "monolayer" represents a ZnSe thickness of 0.28 nm and corresponds to the distance between two [0 0 2] planes of the bulk ZnSe crystal.

Apart from a small shift towards longer wavelengths, the absorption spectra are unaffected by the growth of the shell. No line broadening of the photoluminescence spectra is observed. However, the luminescence intensity increases uniformly up to a shell thickness of about 1.4 ML and then decreases. We believe that this decrease is due to the presence of crystal defects in the shell (stacking fault), since annealing for one to two hours at the growth temperature makes it possible to achieve a final increase in the fluorescence quantum yield from about 6% in the case of CdSe core nanocrystals to 85% after growth of the shell.

Figure 4:
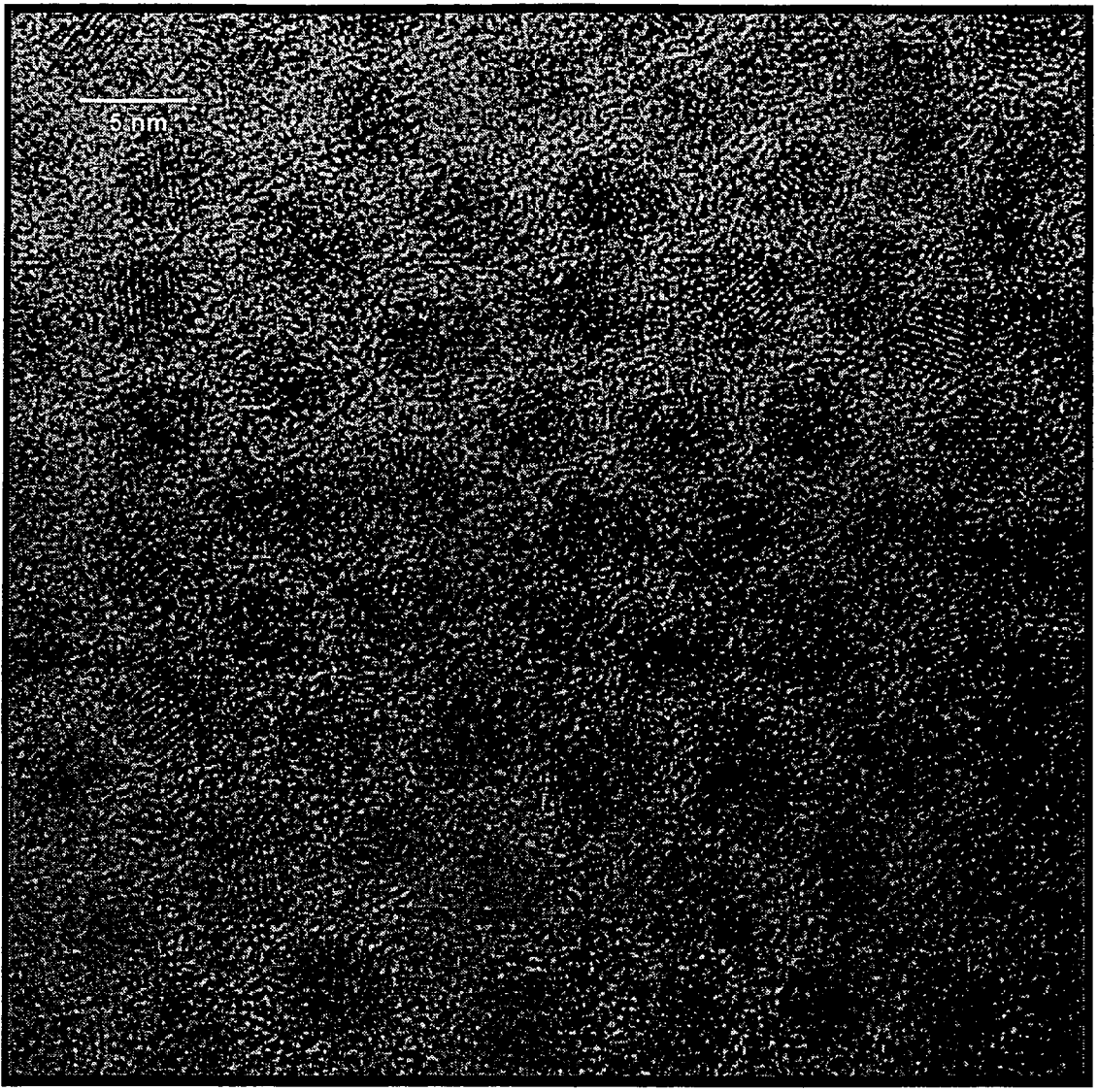
FIG. 4 is a TEM image of CdSe/ZnSe core/shell nanocrystals prepared by the method of the invention, the core diameter of which is 3.2 nm.

FIG. 4 shows the TEM image (300 kV acceleration voltage) of such core/shell nanocrystals obtained by growing about 3 ZnSe monolayers on CdSe crystals with a diameter of 3.2 nm.

The results obtained by the same reaction, carried out in pure TOPO, that is to say in a manner not according to the invention, emphasize the importance of the HDA/TOPO solvent mixture for preparing the shells. No improvement in quantum yield is observed using pure TOPO and a second peak in the photoluminescence spectra, at around 400 nm, indicates the formation of ZnSe nuclei or nanocrystals instead of epitaxial deposition of ZnSe on the CdSe nanocrystals.

The invention will now be described with reference to the following examples, given by way of illustration but implying no limitation.

EXAMPLES

All handling of materials sensitive to air was carried out using a standard (or Schlenk-type) vacuum line.

Optical characterization: the UV-visible absorption spectra were measured on a HEWLETT-PACKARD® 8 452A spectrophotometer and the photoluminescence spectra were obtained by a CCD camera coupled to a JOBIN-YVON® HR 460 monochromator, the resolution of which was 0.1 nm, the excitation wavelength (365 nm) being rejected by a high-pass filter (cut-off at 400 nm).

For these spectroscopic measurements, the dilute colloidal solutions of nanocrystals in toluene were placed in quartz dishes of 1 mm optical path.

The fluorescence quantum yields at room temperature were obtained by comparing the emission intensity, integrated spectrally, of the solution of nanocrystals in toluene with that of a RHODAMINE 6G solution in ethanol, the two solutions having exactly the same optical density (<0.03) at the excitation wavelength.

All the products came from ALDRICH. Cadmium oxide (99.9% purity), zinc oxide (99.9% purity), selenium powder (99.999% purity), as well as the toluene, methanol and anhydrous n-butanol, were used as such. The trioctylphosphine (TOP; 90% purity), trioctylphosphine oxide (TOPO; 90% purity) and hexadecylamine (HDA; 90% purity) were purified by distillation.

Since dodecylphosphonic acid (DDPA) is not commercially available, it was synthesized using the method published in Method. Org. Chem. 12/1, pages 352-353, 435 (1963). The product was identified by NMR spectroscopy of the $^1H$, $^{13}C$ and $^{31}p$ nuclei. The zinc stearate was synthesized from zinc hydroxide and stearic acid and characterized by infrared spectroscopy and elemental analysis.

Example 1

In this example, the preparation of CdSe core nanocrystals is described.

These crystals were used later for a preparation of CdSe/ZnSe core/shell nanocrystals.

51.4 mg of CdO (0.4 mmol) were placed in a two-necked flask under a constant stream of purified argon. Next, 1.15 ml of TOPO and 2.85 ml of HDA were added, forming the solvent mixture with an HDA molar fraction of 80%. The flask was then heated to 200° C., with magnetic stirring. At this point, 230 µl of DDPA (0.8 mmol) were added and the temperature was increased to about 270° C. for a time of 1 h. The complexation reaction took place during this time and was manifested by the formation of a colourless solution. Thereafter, the temperature was lowered to 250° C. and stabilized thereat.

A selenium solution of 0.2 mol/l concentration was prepared separately, at room temperature, by dissolving 157.9 mg (2 mmol) of Se powder in 10 ml of TOP. 2.5 m/l of this solution were rapidly injected into the flask containing the Cd precursor solution, again with vigorous stirring. 100 µl amounts were periodically removed from the reaction mixture so as to monitor the nanocrystal growth process. The narrowest size distribution was obtained when the reaction was stopped within the range between 3 and 30 minutes after injection, the mean diameter of the nanocrystals ranging from 3.5 nm (for 3 minutes of reaction) to 4.6 nm (30 minutes). The reaction mixture was cooled to about 60° C. when the desired size was obtained. The core nanocrystals were then precipitated by adding a mixture consisting of 10 ml of methanol and 1 ml of n-butanol. They were then separated from the excess liquid by centrifugation, washed with methanol and dried by a stream of argon. The nanocrystals were able to be redissolved in various organic solvents, such as toluene, chloroform, alkanes, ethers, etc., in order to measure their optical properties.

The absorption and photoluminescence spectra of the series of samples taken over the course of the reaction described above are given in FIG. 2.

The absorption spectrum has, in addition to the exciton peak, features characteristic of excited states of higher energy. The photoluminescence peak has a small mid-height width, namely between 25 and 29 nm, which undeniably indicates that the size distribution of the nanocrystals prepared according to the invention is very narrow. This is confirmed by determining the size distribution obtained by TEM: the maximum deviation from the mean is less than 5%, without having used any size-sorting process, as in the prior art.

Figure 2:
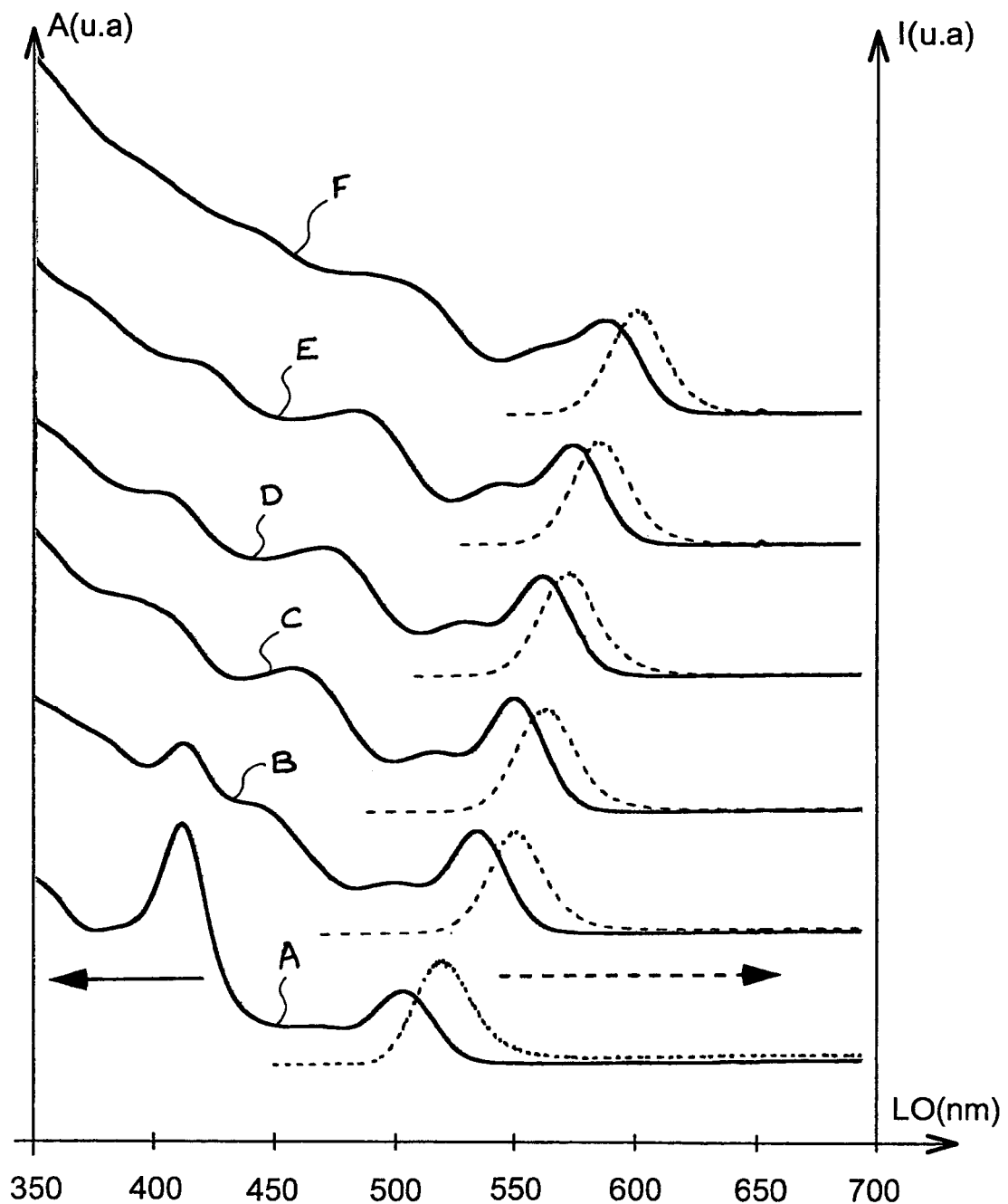
Figures 3A, 3B, 3C:
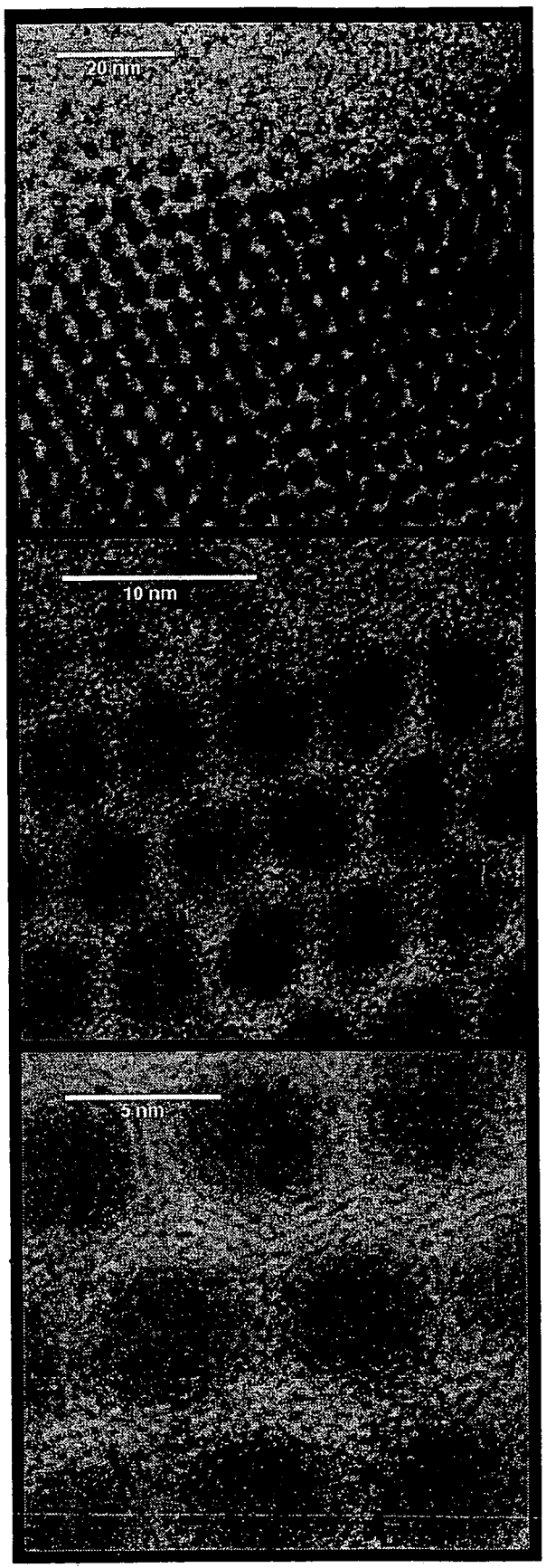
FIG. 3 (FIGS. 3A, 3B and 3C) show TEM (transmission electron microscope) images of CdSe crystals after a synthesis time of 10 minutes at 250° C. obtained by the method of the invention. The markers in FIGS. 3A, 3B and 3C give the respective scales, namely 20 nm, 10 nm and 5 nm.

FIG. 3 shows the TEM image obtained with an acceleration voltage of 300 kV on a JEOL 3010 electron microscope, of CdSe nanocrystals taken after 10 minutes during the reaction monitored in FIG. 2: thanks to the method according to the invention, the size distribution of the nanocrystals is narrow enough to allow them to "crystallize" in a three-dimensional supernetwork.

Example 2

This example describes the preparation of CdSe/ZnSe core/shell nanocrystals using ZnO as zinc source.

162.8 mg of ZnO (2 mmol) were complexed in a flask by 1.15 ml of DDPA (4 mmol) dissolved in 3.4 ml of TOPO heated to 350° C. This transparent colourless mixture was cooled to about 60° C. and then 5.4 ml of toluene were added, giving a solution whose Zn concentration was 0.2 mol/l. 2.5 ml of this solution were mixed at room temperature with the same volume of an Se solution in TOP with a concentration of 0.2 mol/l prepared as in Example 1. All of this mixture was placed in a syringe.

About 20 mg of core nanocrystals, with a mean diameter of 3.6 nm and a size dispersion of less than 5%, that were prepared as described in Example 1 were dispersed, in the flask intended for the synthesis, in a solvent mixture consisting of 2.0 ml of TOPO and 2.0 ml of HDA (i.e. a molar ratio of about 2 for 3). This mixture was heated to 190° C. As soon as the temperature stabilized, the solution containing the Zn/Se mixture was slowly injected into the flask by a syringe driver at a rate of 5 ml/h, the contents of the flask being vigorously stirred. The growth of the shell was monitored by taking samples periodically, as described in Example 1. When the injection of the Zn/Se mixture had been completed, the flask was left at 190° C. for 90 minutes so as to "anneal" the nanocrystals, and try to remove the stacking faults in the shell and at the core/shell interface. The synthesis was completed by cooling the flask to 60° C. The nanocrystals obtained were precipitated and purified by the method described in Example 1. They were redissolved in an organic solvent in order to determine their optical properties (cf. Example 1).

Example 3

This example describes the preparation of CdSe/ZnSe core/shell nanocrystals with zinc stearate as zinc source.

A zinc stearate solution of 0.2 mol/l concentration was prepared in a flask by dissolving 632.3 mg of zinc stearate (1 mmol) in 5 ml of toluene and by heating the solution moderately.

2.5 ml of this solution were mixed at room temperature with the same volume of an Se solution in TOP with a concentration of 0.2 mol/l, prepared as in Example 1. All of this mixture was placed in a syringe.

The rest of the synthesis was absolutely identical to that of Example 2, both as regards the preparation of the dispersion of core nanocrystals and the temperatures, times, etc. The steps after synthesis were carried out likewise.

The invention claimed is:

1. A luminescent material comprising nanocrystals comprising a core surrounded by a shell, said core consisting of a nanocrystal of semiconductor of formula AB in which A represents a metal or a metalloid in oxidation state (II) and B represents a chemical element in oxidation state (VI), and said shell consisting of a ZnSe layer whose surface is provided with an organic passivation layer comprising at least one primary amine and at least one phosphine oxide, phosphine selenide compound or both a phosphine oxide and a phosphine selenide.

2. The luminescent material according to claim 1, in which A is at least one of Cd or Hg.

3. The luminescent material according to claim 1, in which B is chosen from the group consisting of Se, S and Te.

4. The material according to claim 1, in which the primary amine is an alkyl amine whose alkyl group contains from 6 to 24 carbon atoms.

5. The material according to claim 1, in which the phosphine oxide is an trialkylphosphine oxide whose alkyl group contains from 4 to 12 carbon atoms.

6. The luminescent material according to claim 1, in which the phosphine selenide is an trialkylphosphine selenide whose alkyl group contains from 4 to 12 carbon atoms.

7. The luminescent material according to claim 1, in which the organic passivation layer consists of hexadecylamine (HDA), trioctylphosphine oxide (TOPO), or trioctylphosphine selenide (TOPSe).

8. The luminescent material according to claim 1, in which the semiconductor nanocrystal core has a diameter ranging from 2 to 7 nm.

9. The luminescent material according to claim 1, in which the nanocrystals of core/shell structure under excitation emit in the 470 to 630 nm spectral range.

10. The luminescent material according to claim 1, in which the nanocrystals of core/shell structure have an emission line with a half-height width of less than or equal to 30 nm.

11. The luminescent material according to claim 1, in which the nanocrystals of core/shell structure have a luminescence quantum yield of greater than 60% at room temperature.

12. The luminescent material according to claim 1, in which the nanocrystals have a size distribution with a size dispersion standard deviation of less than 5%.

13. The luminescent material according to claim 1, in which the ZnSe layer is an epilayer.

14. A method of preparing nanocrystals of a semiconductor of formula AB where A represents a metal or a metalloid in oxidation state (II) and B represents a chemical element in oxidation state (VI), comprising
reacting an oxide of A complexed by an alkylphosphonic acid with powder of B dissolved in a trialkylphosphine, wherein the reaction is carried out in a solvent comprising a mixture of at least one trialkylphosphine oxide and at least one primary alkylamine.

15. The method according to claim 14, in which A is at least one of Cd or Hg.

16. The method according to claim 14, in which B is at least one of Se, S or Te.

17. The method according to claim 14, in which AB is CdSe, the oxide of A is CdO and the powder of B is selenium powder.

18. The method according to claim 14, in which the alkylphosphonic acid satisfies the formula:

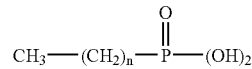

where n is an integer from 5 to 15.

19. The method according to claim 14, in which the alkyl group of the alkylamine contains from 6 to 24 carbon atoms.

20. The method according to claim 14, in which the alkyl groups of the trialkylphosphine and of the trialkylphosphine oxide contain from 4 to 12 carbon atoms.

21. The method according to claim 14, in which the solvent comprises a mixture of an alkylamine and a trialkylphosphine oxide.

22. The method according to claim 21, in which the solvent comprises, in mol %, 40 to 20% TOPO and 60 to 80% HDA.

23. The method according to claim 14, in which the reaction is carried out at a temperature of 240 to 300° C.

24. The method according to claim 14, in which the reaction time is from 2 to 90 minutes.

25. A method of preparing nanocrystals comprising a core surrounded by a ZnSe shell, comprising:
firstly, preparing core nanocrystals made of semiconductor of formula AB, in which A represents a metal or a metalloid in oxidation state (II) and B represents a chemical element in oxidation state (VI), by the method according to claim 14;
dispersing said core nanocrystals in a solvent comprising a mixture of at least one trialkylphosphine oxide and of at least one primary alkylamine; and
adding a solution of a source of zinc chosen from complexed ZnO and zinc carboxylates of formula $Zn(R\text{-}COO)_2$, where R represents an aliphatic alkyl group containing from 1 to 24 carbon atoms, and a solution of selenium powder in a trialkylphosphine, to said dispersion of core nanocrystals heated to a temperature of 170 to 210° C., to grow a ZnSe shell on the semiconductor core nanocrystals.

26. The method according to claim 25, in which the ZnSe shell is grown epitaxially.

27. The method according to claim 25, in which the reaction mixture obtained during the final step is maintained at a temperature of 170 to 210° C. for a time of one to two hours.

28. The method according to claim 25, in which A is at least one of Cd or Hg and B is at least one of Se, S or Te.

29. The method according to claim 25, in which the alkyl group of the alkylamine contains from 6 to 24 carbon atoms.

30. The method according to claim 25, in which the alkyl groups of the trialkylphosphine and the trialkylphosphine oxide contain from 4 to 12 carbon atoms.

31. The method according to claim 25, in which the solvent comprises a mixture of trioctylphosphine (TOPO) and hexadecylamine (HDA).

32. The method according to claim 31, in which the solvent comprises 40 to 20 mol % TOPO and 60 to 80 mol% HDA.

33. The method according to claim 25, in which the zinc source ZnO is complexed by an alkylphosphonic acid of formula:

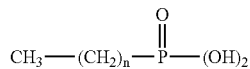

where n is an integer from 5 to 15.

34. The method according to claim 25, in which the zinc source is zinc stearate.

35. The method according to claim 25, in which the zinc source solution and the selenium powder solution are mixed together prior to the addition, and then the mixture is injected into the dispersion of core nanocrystals.

36. The method according to claim 25, in which the addition of the zinc source solution and the selenium powder solution is carried out very slowly and at a constant rate.

37. The method according to claim 25, in which the addition is carried out over a time ranging from 30 to 90 minutes.

38. The luminescent material according to claim 1, wherein the primary amine is hexadecylamine (HAD).

39. The luminescent material according to claim 1, wherein the phosphine oxide is trioctylphosphine oxide (TOPO).

40. The material according to claim 1, wherein the phosphine selenide is trioctylphosphine selenide (TOPSE).

41. The material according to claim 1, wherein the organic passivation layer consists of one of hexadecylamine, trioctylphosphine, or trioctylphosphine selenide.

42. The luminescent material according to claim 1, wherein the nanocrystals of core/shell structure have a luminescence quantum yield of greater than 80% at room temperature.

43. The luminescent material according to claim 1, wherein the nanocrystals of core/shell structure have a luminescence quantum yield of 85% at room temperature.

44. The method of claim 14, wherein the reaction is carried out in a solvent consisting of a mixture of trialkylphosphine oxide and a primary alkylamine.

45. The method according to claim 14, wherein the alkyl group of the alkylamine contains from 14 to 24 carbon atoms.

46. The method according to claim 14, wherein the alkyl group of the alkylamine contains 16 carbon atoms.

47. The method according to claim 14, wherein the alkyl groups of the trialkylphosphine and the trialkylphosphine oxide contain 8 carbon atoms.

48. The method according to claim 14, wherein the solvent is a mixture of trioctylphosphine oxide and hexadecylamine.

49. The method according to claim 14, wherein the solvent consists of a mixture of an alkylamine and a trialkylphosphine oxide.

50. The method of claim 25, wherein the solvent consists of a mixture of at least one trialkylphosphine oxide and a primary alkylamine.

51. The method according to claim 25, wherein the alkyl group of the alkylamine contains 16 carbon atoms.

52. The method according to claim 25, wherein the alkyl groups of the trialkylphosphine and the trialkylphosphine oxide contain 8 carbon atoms.

53. The method according to claim 33, wherein the zinc source is complexed by dodecyl phosphonic acid (DDPA).

* * * * *